United States Patent [19]
Coulmance et al.

[11] 4,119,835
[45] Oct. 10, 1978

[54] ELECTRONIC THERMOSTAT

[75] Inventors: Jean-Pierre Rene Coulmance, Osny; Jean-Claude Gerard Six, Sevres, both of France

[73] Assignee: U.S. Philips Corporation, New York, N.Y.

[21] Appl. No.: 749,877

[22] Filed: Dec. 13, 1976

[30] Foreign Application Priority Data

Dec. 18, 1975 [FR] France .............................. 75 38854

[51] Int. Cl.² .............................................. H05B 1/02
[52] U.S. Cl. .................................... 219/501; 323/19; 323/40
[58] Field of Search .............. 219/494, 497, 499, 501; 323/19, 40, 22 SC; 307/252 YA, 252 W

[56] References Cited
U.S. PATENT DOCUMENTS

| 3,381,226 | 4/1968 | Jones et al. | 307/252 UA |
| 3,443,121 | 5/1969 | Weisbrod | 219/497 |
| 3,553,429 | 1/1971 | Nelson et al. | 219/501 |
| 3,935,482 | 1/1976 | Fox et al. | 307/252 UA |

Primary Examiner—J. V. Truhe
Assistant Examiner—Fred E. Bell
Attorney, Agent, or Firm—Frank R. Trifari; Bernard Franzblau

[57] ABSTRACT

A method and device for controlling the power supplied to an a.c. powered load by zero-passage switching.

A ripple voltage which is superimposed on the control voltage synchronizes the start of a sawtooth voltage in a small range on both sides of the zero passage of the power-supply sinewave for the load.

The device is employed in electric heating systems.

13 Claims, 3 Drawing Figures

ELECTRONIC THERMOSTAT

The invention relates to a method of controlling the supply of power to an electric load from an alternating voltage or a pulsating rectified voltage by means of a thyristor or similar semiconductor switch to whose control electrode pulses are applied which have been derived from a sawtooth voltage whose repetition frequency depends on a d.c. control voltage.

The invention also relates to a thermostatic device embodying the above-mentioned method, which device, inter alia, comprises a heating resistor connected in series with a thyristor or other gate-controlled semiconductor switch, a direct voltage source, and a sawtooth generator whose input is coupled to a temperature probe and whose output is connected to the control electrode of the semiconductor switch.

The invention is employed in particular, but not exclusively, for controlling convectors which are used for the electric heating of rooms.

The drawbacks of conventional thermostats, such as bimetal thermostats, used for temperature control are known: inaccuracy, a considerably hysteresis, noisy operation, RF interference, contact wear etc. For certain applications the use of electronics provides more satisfactory solutions through the use of sensitive elements such as thermocouples or thermistors in which a continuous temperature variation causes a continuous analog variation of an electrical parameter.

In this way a thermistor associated with an integrated circuit which is commercially available from N. V. Philips Gloeilampenfabrieken under the designation "TCA280A" enables most control problems to be solved.

In the case where such control devices are incorporated in low or medium-power convectors, the costs of such circuits represent a considerable part of the overall price of the equipment and thus prohibit the large-scale adoption of advanced temperature control means.

Electronic control methods which employ the electric AC house supply as a power source may be classified into two main groups, namely phase-control circuits (or cyclic switching circuits) and zero-passage switching circuits.

In phase-control circuits a switching element, e.g. a thyristor, is kept turned off from the beginning of a half-cycle for a specific fraction of this half-cycle and is subsequently turned on until the end of the half-cycle. A control signal, whose delay relative to the beginning of a each half-cycle varies, enables the off-time/on-time ratio to be varied, and thus a average power which is dissipated in the load connected in series with the thyristor or other semiconductor switch may be controlled.

The phase control method has one major drawback. The build-up of the current during a half-wave causes a surge voltage whose amplitude is given by Lenz's law. This effect even occurs for purely resistive loads because the supply source generally has a highly inductive impedance.

The surge voltage gives rise to very annoying spurious signals in the RF bands, which necessitates the use of expensive and bulky damping filters.

In zero-passage switching circuits the voltage is applied to the load in the form of trains of full half-cycles, switching on and off being effected at the instants of time when the current is substantially zero. The amplitude of the switching transients is then generally negligible. The above-mentioned circuit TCA 280 A, which belongs to this group of switching circuits, employs a Schmitt trigger for determining the instant of zero passage.

It is to be noted, however, that these circuits detect the zero passage of the AC supply voltage, which necessitates the addition of a phase-shifting network if an inductive or capacitive load is to be controlled so as to ensure that switching on and off is effected when the current is zero or substantially zero. This limits the interchangeability of loads with different power factors.

In a known circuit arrangement with discrete components switching on and off during the zero passages is effected without the use of a detection circuit. In this circuit arrangement a first semiconductor switch is fired during the positive half-cycles of the supply voltage by periodic discharges of a capacitor when a second semiconductor switch is conductive, whereas during the negative half-cycles firing is effected by periodic discharges of a second capacitor.

It is to be noted that the train of half-cycles can be switched on and off for the first time at an arbitrary instant during the first positive half-cycle of the sine-wave, which is most likely to be accompanied by a substantial switching surge. In the case of a rapid succession of trains of half-waves the spurious signals may become almost as annoying as in the case of phase-control circuits.

Moreover, the said circuit arrangement necessitates the use of two large well insulated capacitors which is in conflict with a compact design.

It is an object of the invention to realize a simple and inexpensive switching circuit which operates virtually without producing any spurious signals.

It is a further object of the invention to control loads with different power factors without any modification of the circuit arrangement.

In accordance with the invention the method of controlling the power supplied to an electric load from an alternating voltage or a pulsating rectified voltage by means of a thyristor or similar semiconductor switch, to whose control electrode pulses are applied which have been derived from a sawtooth voltage whose repetition frequency depends on a d.c. control voltage, is characterized in that an alternating voltage with twice the frequency of the supply voltage and with a phase-shift of substantially 90° relative to the supply voltage is superimposed on the d.c. control voltage.

In accordance with a further characteristic feature of the invention the thermostatic device embodying the method, which device inter alia comprises a heating resistor in series with a thyristor or similar semiconductor switch, a direct voltage source, and a sawtooth generator whose input is coupled to a temperature probe and whose output is connected to the control electrode of the semiconductor switch, is characterized in that the phase-shifting network, which consists of a resistor and a capacitor, is disposed between the source of alternating voltage or pulsating rectified voltage and the input of the sawtooth generator, and that two semiconductor diodes are connected in anti-parallel between this input and a resistor bridge which is disposed between the terminals of the direct voltage source.

Preferably, the phase-shifting network also acts as a part of the smoothing filter of the direct voltage source.

The phase shift of the alternating voltage which is superimposed on the control voltage is such that the derivative of the alternating voltage with respect to time is a maximum near the zero passage of the alternating supply voltage. In the case of control voltage variations the sawtooth voltage is consequently started in a small range on both sides of the zero passage, corresponding pulses at the control electrode turning on the thyristor or similar device at the instant at which the hold current of the latter is reached.

The invention will be described in more detail by way of example with reference to the accompanying drawings in which.

Figure 1:
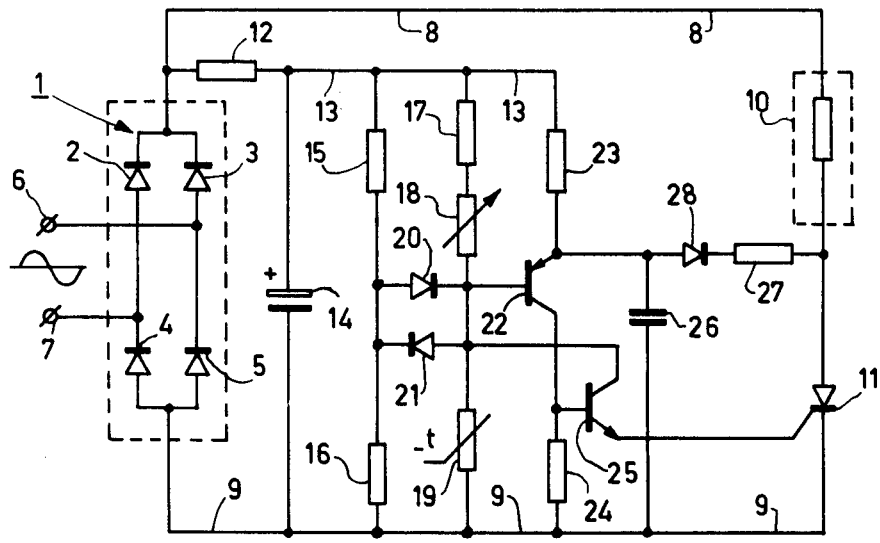
FIG. 1 shows the circuit diagram of a temperature control device embodying the method in accordance with the invention.

In FIG. 1 the inputs of a rectifying bridge 1, which comprises four diodes 2, 3, 4 and 5, are connected to two a.c. supply terminals 6 and 7. The interconnected cathodes of the diode 2 and 3 and the interconnected anodes of the diodes 4 and 5 are connected to the positive conductor 8 which carries a pulsating rectified current and to a common negative conductor 9, respectively.

One end of a heating resistor 10 is connected to the positive conductor 8 and the other end to the anode of a thyristor 11. The thyristor cathode is connected to the negative conductor 9.

One end of a resistor 12 is connected to the positive conductor 8 and the other end to the positive conductor 13 which carries a partly smoothed current.

Included between the negative conductor 9 and the positive conductor 13 are, in this order, an electrolytic capacitor 14, a first bridge including the resistors 15 and 16 in series, a second bridge comprising in series, a standard resistor 17, a variable resistor 18 and a thermistor 19. Two diodes 20 and 21 are connected in anti-parallel between the common point of the resistors 15 and 16 and the common point of the resistors 18 and 19.

The emitter and the collector of a first oscillator transistor 22 of the pnp-type are respectively connected to the conductor 13 via a resistor 23 and to the conductor 9 via the resistor 24, while the base of this transistor is connected to the common point of the two resistors 18 and 19.

The emitter and the collector of a second oscillator transistor 25 of the npn-type are respectively connected to the control electrode of the thyristor 11 and to the base of the transistor 22.

A capacitor 26 is connected between the emitter of the transistor 22 and the negative conductor 9. One end of a resistor 27 is connected to the anode of the thyristor 11 and the other end to the cathode of a diode 28, whose anode is connected to the emitter of the transistor 22.

The device of FIG. 1 operates as follows:

The a.c. voltage source supplies power to the entire circuit arrangement. The diode bridge 1 is a full-wave rectifier and supplies the load 10 directly, whereas the control circuit is supplied via the smoothing filter R12-C14.

The control voltage which is produced as a result of variations of the resistance of the NTC resistor 19 is compared, via the diodes 20 and 21, with a reference voltage which is supplied by the bridge consisting of the resistors 15 and 16. The diodes serving to limit the excursion of the voltage at the base of the transistor 22 so as to enable the circuit arrangement to operate over a wide range of temperatures.

The sawtooth voltage is obtained by charging the capacitor 26 via the resistor 23. When the voltage across the capacitor exceeds the base voltage of the transistor 22, this transistor is turned on and supplies current to the base of the transistor 25. The current through the collector of the transistor 25, which is connected to the base of the transistor 22, thus causes the base current of the transistor 22 to increase etc. As a result of this cumulative process the two transistors 22 and 25 are rapidly bottomed, the capacitor 26 being discharged via these transistors and the control electrode of the thyrister 11.

The relaxation period of the sawtooth voltage depends on the value of the resistor 23 and of the capacitor 26, on the base voltage of the transistor 22, and on the supply voltage across the positive conductor 13 and the negative conductor 9, which are proportioned so that a value is obtained of approximately 19 milliseconds, i.e. half the period of the AC supply voltage.

Figure 2:
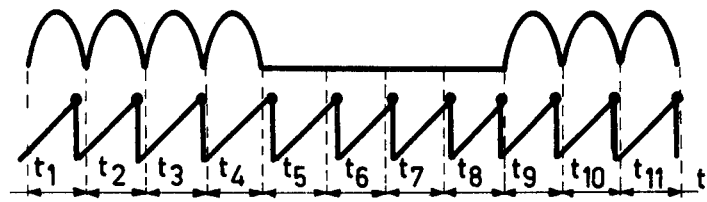
FIG. 2 shows a voltage/time diagram to illustrate the method in accordance with the invention.

In FIG. 2, which illustrates the principle of the device, the upper waveform represents the voltage across the thyristor 11 and the lower waveform represents the corresponding sawtooth voltage.

During the time intervals $t_1$, $t_2$ and $t_3$ the period of the sawtooth voltage is shorter than that of a half-cycle of the rectified voltage, and the load 10 is not energized. In the time interval $t_4$ the period of the sawtooth is longer than half a period of the AC supply voltage so that the capacitor is discharged at the beginning of the time interval $t_5$, whereupon thyristor 11 is turned on. This thyristor remains conducting during the time intervals $t_5$, $t_6$, $t_7$ and $t_8$. However at the end of time interval $t_8$ the period of the sawtooth has become smaller than half a period of the AC supply voltage so that, the thyristor is turned off and remains turned off during the time intervals $t_9$, $t_{10}$ and $t_{11}$.

If the period of the sawtooth voltage varies in inverse proportion to the temperature, a self-controlling system is obtained, the on-time/off-time ratio of the thyristor being a function of the loss of heat of the heating system.

Figure 3:
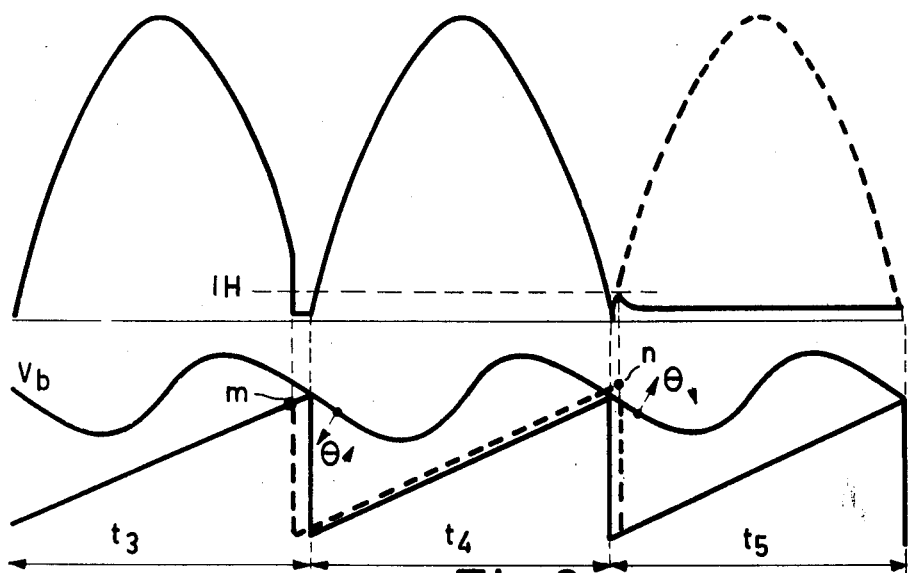
FIG. 3 shows a portion of the diagram of FIG. 2 on an enlarged scale, the synchronizing voltage supplied by the device of FIG. 1 also being included.

FIG. 3, which shows a part of the waveform of FIG. 2 on an enlarged scale, represents the process of controlling the sawtooth period.

This Figure also shows the waveform $Vb$ which represents the direct voltage which is applied between the base of the transistor 22 and the conductor 9. It can be seen that this direct voltage has a substantial ripple with a frequency which is twice the AC supply frequency and approximately 90° phase-shifted relative to the rectified halfwaves.

As the sawtooth starts at the instant at which the voltage $Vb$ (at the $Vbe$ of the transistor 22) is attained, starting is effected exactly at the zero passage of the supply voltage half-cycles (sawtooth waveforms represented by solid lines in the Figure), and the thyristor cannot be fired.

When the temperature of the thermistor 19 increases the voltage $Vb$ decreases and the sawtooth is started at the end of the time interval $t_3$ at the instant $m$ (dashed line). If the pulse at the control electrode appears at a point on the falling portion of the supply voltage half-wave where the hold current IH of the thyristor is sufficient, the thyristor can be fired and remains on very briefly so as to be turned off at the zero passage. Thus, it will be apparent that the variation of $Vb$ in a decreasing sense hardly ever suffices to cause such brief ignition.

When the temperature of the thermistor decreases, the voltage $Vb$ increases again and the sawtooth is then started at the beginning of the time interval $t_s$ at the instant $n$, which in this case corresponds to the value of the hold current IH of the thyristor 11 at which this thyristor can ignite.

The thyristor 11 is thus fired upon each half-wave when the sawtooth is started at an instant after the current IH is reached.

The temperature rise of the thermistor then causes the voltage $Vb$ to decrease again and the system is stabilized at the desired temperature.

It is apparent that the sensitivity of the system is related to the slope $dv/dt$ of the voltage $Vb$ at the instants at which the sawtooth starts. However, the maximum ripple of the voltage $Vb$ is limited so that premature starting of the sawtooth at the "dips" of said voltage is prevented, starting then being effected near the tops of the supply-voltage halfwaves.

The sensitivity of the system is such that it can control a temperature with an accuracy of 0.1° C., which implies that the load is switched on and off at a high frequency; however, if the power to be switched is high and the internal impedance of the voltage source constituted by the AC supply is abnormally high, the rapid fluctuations of the current consumption may become annoying. In order to mitigate this drawback the on/off frequency is reduced by increasing the charging time of the capacitor when the thyristor 11 is conducting. Under these conditions the diode 28 conducts and the resistor 27 drains a part of the charging current of the capacitor. This results in an increase of the control hysteresis of approximately 0.5° C., which in practice amply suffices for most heating systems.

The device in accordance with the invention can readily be adapted, in a manner not shown, to control a load connected to the supply terminals 6 and 7 by means of a gate-controlled semiconductor switch. In that case it suffices to use a load 10 and a thyristor 11 of low power, the gate electrode of the gate-controlled semiconductor switch being coupled to that of the thyristor by means of a pulse transformer.

What is claimed is:

1. A method of controlling the power supplied to an electric load from a source of alternating supply voltage and applied to the load as a pulsating rectified voltage by means of a semiconductor switch comprising, monitoring a physical quantity applying to the control electrode of the semiconductor switch pulses which have been derived from a sawtooth voltage whose repetition frequency depends on a d.c. control voltage that varies as a function of the physical quantity, and superimposintg an alternating voltage with twice the frequency of the supply voltage and with a phase-shift of substantially 90° relative to the supply voltage on the d.c. control voltage.

2. A thermostatic device for controlling the power to a heating resistor comprising, a semiconductor controlled switch, a pair of supply terminals for a source of alternating voltage or a pulsating rectified voltage, means connecting the heating resistor in series with the semiconductor switch, a direct voltage source, a sawtooth generator having an input coupled to a temperature probe and an output connected to the control electrode of the semiconductor switch, a phase-shifting network including a resistor and a capacitor connected between the supply terminals and the input of the sawtooth generator, a resistor bridge connected between the terminals of the direct voltage source, and two semiconductor diodes connected in anti-parallel between the sawtooth generator input and said resistor bridge.

3. A device as claimed in claim 2 wherein the phase-shifting network is connected to the supply terminals so as to operate as a part of a smoothing filter for the direct voltage source.

4. A device as claimed in claim 2 characterized in that the sawtooth generator comprises a resistor, a capacitor, and two complementary transistors having their bases and collectors interconnected.

5. A device as claimed in claim 4 wherein the semiconductor switch comprises a thyristor, and means connecting the emitter of one of the transistors to the control electrode of the thyristor.

6. A device as claimed in claim 5, characterized in that the control electrode of the thyristor is connected to the gate electrode of a gate-controlled semiconductor switch by a pulse transformer.

7. A device as claimed in claim 2 wherein the semiconductor switch comprises a thyristor and the sawtooth generator includes a timing capacitor, a resistor, a third semiconductor diode, and means connecting a main electrode of the thyristor to one of the electrodes of the timing capacitor via said resistor and said third semiconductor diode connected in series.

8. A control system for controlling the power to an electric load as a function of a physical quantity comprising; a pair of supply terminals for a source of periodic supply voltage of a given frequency, a semiconductor controlled switch connected in circuit so as to control the power supplied to the load from said supply terminals, a sawtooth generator having an input and an output, the output being coupled to the control electrode of the semiconductor switch, a device responsive to said physical quantity for varying an electric parameter as a function thereof, means including said device for deriving a DC control voltage having an AC component of a frequency that is in integral multiple of the supply voltage frequency and with a phase shift of 90° relative to the supply voltage, and means coupling said control voltage to the input of the sawtooth generator so as to vary the frequency of the sawtooth waveform generated thereby as a function of the control voltage.

9. A control system as claimed in claim 8 wherein the supply voltage is an AC sinusoidal voltage and said sawtooth generator includes a semiconductor amplifier and a resistor and capacitor coupled to a source of DC voltage and to said semiconductor amplifier so that the capacitor is periodically discharged via the semiconductor amplifier so as to supply trigger pulses to the control electrode of the semiconductor switch at or near the zero crossings of the AC supply voltage.

10. A control system as claimed in claim 8 wherein the supply voltage is an AC sinewave voltage and said control voltage deriving means includes an RC phase shift circuit coupled to the supply terminals via diode means and to the input of the sawtooth generator.

11. A control system as claimed in claim 10 wherein said RC phase shift circuit derives a DC voltage with an AC ripple component for the input of the sawtooth generator, said control system further comprising first and second series connected resistors coupled to the RC phase shift circuit to receive said DC voltage with the AC ripple component, and first and second diodes connected in anti-parallel between the sawtooth generator input and a junction point between said first and second series connected resistors.

12. A control system as claimed in claim 8 wherein the supply voltage is an AC sinusoidal voltage and the frequency of said AC component is twice the supply voltage frequency, the semiconductor switch includes a thyristor, the sawtooth generator comprises an amplifier coupled to a first RC circuit, said DC control voltage deriving means includes diode means coupled to the supply terminals to derive a pulsating DC voltage and an RC filter circuit coupled between the diode means and the input of the sawtooth generator for producing said 90° phase shift of the AC component and a DC voltage coupled to the amplifier and said first RC circuit, and a resistor and a diode connected in series between one main electrode of the thyristor and the capacitor of said first RC circuit.

13. A method of controlling a physical quantity by controlling the power to an electric load from a supply voltage of a given frequency by means of a semiconductor controlled switch comprising, monitoring said physical quantity deriving a DC control voltage with an AC component that is an integral multiple of the supply voltage frequency and with a phase shift of 90° relative to the supply voltage and which control voltage varies as a function of said physical quantity, producing an asymmetrical sawtooth signal whose frequency is varied as a function of the DC control voltage, and applying trigger pulses to a control electrode of the semiconductor switch which are derived from said sawtooth signal and occur at times when the supply voltage is at or near its zero amplitude values.

* * * * *

UNITED STATES PATENT AND TRADEMARK OFFICE
CERTIFICATE OF CORRECTION

PATENT NO.   : 4,119,835
DATED        : October 10, 1978
INVENTOR(S)  : JEAN-PIERRE R. COULMANCE ET AL It is certified that error appears in the above–identified patent and that said Letters Patent are hereby corrected as shown below:

Column 1, line 24, "considerably" should be --considerable--
          line 51, "a each" should be --each--
          line 52, "a average" should be --the average--
          line 53, "the load" should be --a load--

Column 3, line 22, "diode" should be --diodes--

Column 5, line 50, "quantity" should be --quantity,--

Column 8, line 7, "quantity" should be --quantity,--

Signed and Sealed this

First Day of May 1979

[SEAL]

Attest:

RUTH C. MASON
*Attesting Officer*

DONALD W. BANNER
*Commissioner of Patents and Trademarks*